United States Patent [19]
Götz

[11] Patent Number: 5,354,409
[45] Date of Patent: Oct. 11, 1994

[54] APPARATUS FOR PRODUCING LAMINATE BOARDS

[75] Inventor: Wolfgang Götz, Krefeld-Fischeln, Fed. Rep. of Germany

[73] Assignee: G. Siempelkamp GmbH & Co., Krefeld, Fed. Rep. of Germany

[21] Appl. No.: 951,479

[22] Filed: Sep. 25, 1992

Related U.S. Application Data
[62] Division of Ser. No. 774,962, Oct. 9, 1991.

[30] Foreign Application Priority Data
Oct. 12, 1990 [DE] Fed. Rep. of Germany ....... 4032400

[51] Int. Cl.$^5$ .................. B32B 31/08; B32B 31/10; B32B 31/20
[52] U.S. Cl. ................... 156/552; 156/522; 156/556; 156/563
[58] Field of Search ............... 156/563, 566, 560–562, 156/552, 556, 307.4, 307.7, 324, 313, 519, 522, 269

[56] References Cited
U.S. PATENT DOCUMENTS

| | | | |
|---|---|---|---|
| 3,499,821 | 3/1970 | Zinbarg | 156/313 |
| 3,890,185 | 6/1975 | Umazume | 156/562 |
| 4,288,274 | 9/1981 | Holz | 156/563 |
| 4,356,054 | 10/1982 | Gotz | 156/583.1 |
| 4,432,828 | 2/1984 | Siempelkamp | 156/556 |
| 4,505,771 | 3/1985 | George | 156/299 |
| 4,510,008 | 4/1985 | Hoshi | 156/307.7 |
| 4,571,279 | 2/1986 | Oizumi | 156/307.4 |
| 4,946,551 | 8/1990 | Ishige | 156/563 |
| 5,057,175 | 10/1991 | Ashton | 156/583.5 |

*Primary Examiner*—Michael W. Ball
*Assistant Examiner*—Daniel J. Stemmer
*Attorney, Agent, or Firm*—Herbert Dubno

[57] ABSTRACT

A plurality of webs drawn from respective supply rolls forms a core stack which is passed through a single-level press to press boards from the press stack formed by applying cover foils to the core, the latter extending over and forming part of a transport belt that becomes part of the boards. Once the pressed board forming part of the belt is advanced from the press, the pressed board can be cut and trimmed from the belt.

1 Claim, 2 Drawing Sheets

APPARATUS FOR PRODUCING LAMINATE BOARDS

This is a divisional of co-pending application Ser. No. 07/774,962 filed on 9 October 1991.

FIELD OF THE INVENTION

My present invention relates to an apparatus for producing laminate boards of a type in which a cover foil, generally of a synthetic resin material (plastic) or a metal, is bonded to a core, generally composed of a plurality of layers, by heat and pressure. Such boards can be referred to as decor board, since the foil may be a decorative foil and, where the foil is a metal foil, the board may be used industrially in electrical or electronic applications, for example, as printed circuit board. The core can be composed of impregnated fibrous web or sheet material, for example, paper impregnated with melamine resins or nonwoven materials impregnated with thermosetting resins of other types, The core material is generally a kraft paper so impregnated and, when reference is made herein to a kraft paper in the context of the core, it will be understood that I mean to refer to kraft paper impregnated with melamine resins as well as other fibrous layers impregnated with melamine or other thermosetting resins.

The invention also relates to an apparatus utilizing a single level or single stage press for producing laminate board and especially decor laminate board having plastic foil or metal foil cover layers on one or both sides of such a core.

BACKGROUND OF THE INVENTION

In the production of laminate board of the aforedescribed type, it has been a common practice to utilize a single stage or single level platen press for effecting the hot pressing of the stack formed by a plurality of kraft paper sheets on which a decor foil layer has been applied to the higher or lower surface to form a stack or packet which is introduced into the press and subjected to hot pressing therein.

Processes for making pressed board in this manner require relatively expensive and complex systems for assembling the sheets into the stack or packet and relatively complex or expensive units for charging the press with the packet and/or removing the packet from the press.

Included in such means, of course, may be means for drawing the kraft paper from the rolls or coils on which the kraft paper is generally supplied and for cutting the kraft paper webs into the sheets which are to be stacked.

It is, however, also known to form decor laminate strip continuously by sandwiching the core layers between foil layers, all of the layers being drawn from respective rolls or coils. Such systems can make use of continuous presses, for example, a double-belt press in which the stacked layers continuously withdrawn from the respective supplies are guided between a pair of endless steel belts and subjected to pressing between them. A press of this type is comparatively expensive and requires high capital and maintenance cost so that such apparatus is practical only for high production runs. In many cases, the nature of the laminate which is required precludes the use of continuous systems of this type with high production rates.

OBJECTS OF THE INVENTION

It is, therefore, the principal object of the present invention to provide an improved apparatus for producing decor laminate board, whereby the drawbacks of earlier systems are avoided.

It is another object of the invention to provide an apparatus for the production of such board, whereby expensive and time-consuming stack assembly steps and the related equipment can be avoided, whereby expensive apparatus for charging and emptying single-level or single-stage presses are unnecessary, and whereby the use of a continuous or belt-type press is unnecessary.

Another object of the invention is to provide an improved apparatus for producing laminate board which is of comparatively simple construction and low cost.

SUMMARY OF THE INVENTION

These objects and others which will become more readily apparent hereinafter are attained, in accordance with the present invention, in an apparatus operating via a method of making laminate board and, particularly, decor laminates as described above, having a core layer and at least one decor layer applied to the core and subjected to pressure and heat in a single level press. This method can comprise the steps of:

(a) displacing a plurality of continuous core-forming flexible webs along a transport path and stacking the webs to form a core;

(b) maintaining a tension along at least a stretch of the path over which the core extends continuously to form a transport band, the tension being sufficient to prevent substantial sag of the band over the stretch;

(c) intermittently advancing the core in a feed direction by a distance determined by a length of laminate boards to be fabricated while maintaining the tension;

(d) applying at a first location along the path of the stretch to at-least one of upper and lower surfaces of the core a cover foil having substantially the length of the laminate board to be fabricated and the distance of advance and severed from a continuous foil web by shifting the cover foil onto the core transversely to the feed direction during an interval between advances of the band to form a press stack from the cover foil and the core on the band, whereby the press stack is moved in a subsequent advance to a second location along the path and the stretch downstream of the first location;

(e) during a subsequent interval between advances of the band and, at the second location, hot pressing the press stack in a single-level press to produce a laminated board on the band;

(f) in an advance of the band subsequent to production of the laminated board in the press, carrying the laminated board out of the press in the band; and (g) downstream of the stretch cutting the laminated board from the band.

In accordance with this method, the core layer is formed from a plurality of layers of a fibrous material impregnated with a thermosetting resin, e.g. kraft papers drawn from respective coils continuously and the core layer forms a band which passes continuously through the stack forming station and the press in which the stack is consolidated by heat and pressure to form the board which remains part of the band until the board is severed therefrom. Thus the band formed by the continuous core serves as the means for introducing the press packet or stack into the press and for removing it from the press. To form the press packet or stack, the decor foil, severed from a continuous supply, is applied to the upper or lower surface of the core formed by drawing the core layers to be stacked from respective coils in the direction of intermittent advance of the core which can be determined by the cycling cadence of the single level press. The core layers are thus withdrawn at this cadence from the coils and, without subdivision of these layers, form the core stack and are intermittently advanced into and through the press.

The decor layer or layers can be applied in a direction transverse to the feed direction of the kraft paper webs to the stationary core in the intervals between the advance of the webs forming the core, the decor layer or layers being fixed to the coil to form, over the length of the foil applied to the upper and/or lower surface of the core, the press packet.

The press packet is fed to the open single level press by the band formed by the kraft paper webs and is pressed in the latter to the decor laminate plates. Each decor laminate plate is transported by the kraft paper webs, with which the plate remains integral, out of the press by a clamping roller arrangement whose nip engages the core at an upstream end of the stretch. Upstream of the first location and a drawing roller arrangement whose nip engages the band or web downstream of the single level press, a sufficient tension is applied to the stretch so that it remains free from detrimental sag during the transport stages and, of course, during the intervals at which the band or coil is stationary for application of the foils.

The stepping of the core is effected in accordance with the length of the decor laminate boards to be produced.

It will be understood that the foil segments should be fixed to the kraft paper core and this can be done in various ways. For example, I may use a contact adhesive. In its simplest form the attachment of the foil to the core is effected by electrostatic charging of the foil so that the foil will be held by electrostatic forces on the core.

It will be apparent, in the process of the invention, that the kraft paper webs fulfill an additional function beyond that of constituting the core material, namely, they simultaneously form a charging band and emptying band or conveyor for the single level press.

The application of the decor foil segment to the upper or lower surface of the band is effected during the stationary or standstill intervals of this band and pressing also can be effected during standstill of the band allowing a simple single-level press to be used.

The cycling time can be comparatively short since the means for introducing the press packet into the press and the removal of the pressed board portion of the band is effected simply and rapidly.

As a result, the apparatus used for producing the pressed board can be of simple construction and can be controlled simply and with ease.

According to the apparatus aspect of the invention, a core paper supply station is provided which can hold a multiplicity of coils having the core paper webs wound thereon and from which the paper webs can be drawn through a clamping roll assembly, a foil-applying station at which the foil is applied to the upper and/or lower surfaces of the core, a single-level platen press for the hot pressing of the stack formed by applying the decor foil or foils to the core and a further pair of rollers for applying the tension to the core which thereby forms the conveyor band as described.

Downstream of this pair of rollers, a separating (cutting and/or trimming) station or apparatus is provided for severing the decor laminate board from the band.

The foil can be applied in a direction transverse to the transport or feed direction of the band as foil sections cut from a continuous foil supply.

BRIEF DESCRIPTION OF THE DRAWING

The above objects, features and advantages of my invention will become more readily apparent from the following description, reference being made to the accompanying drawing in which.

SPECIFIC DESCRIPTION

Figure 1:
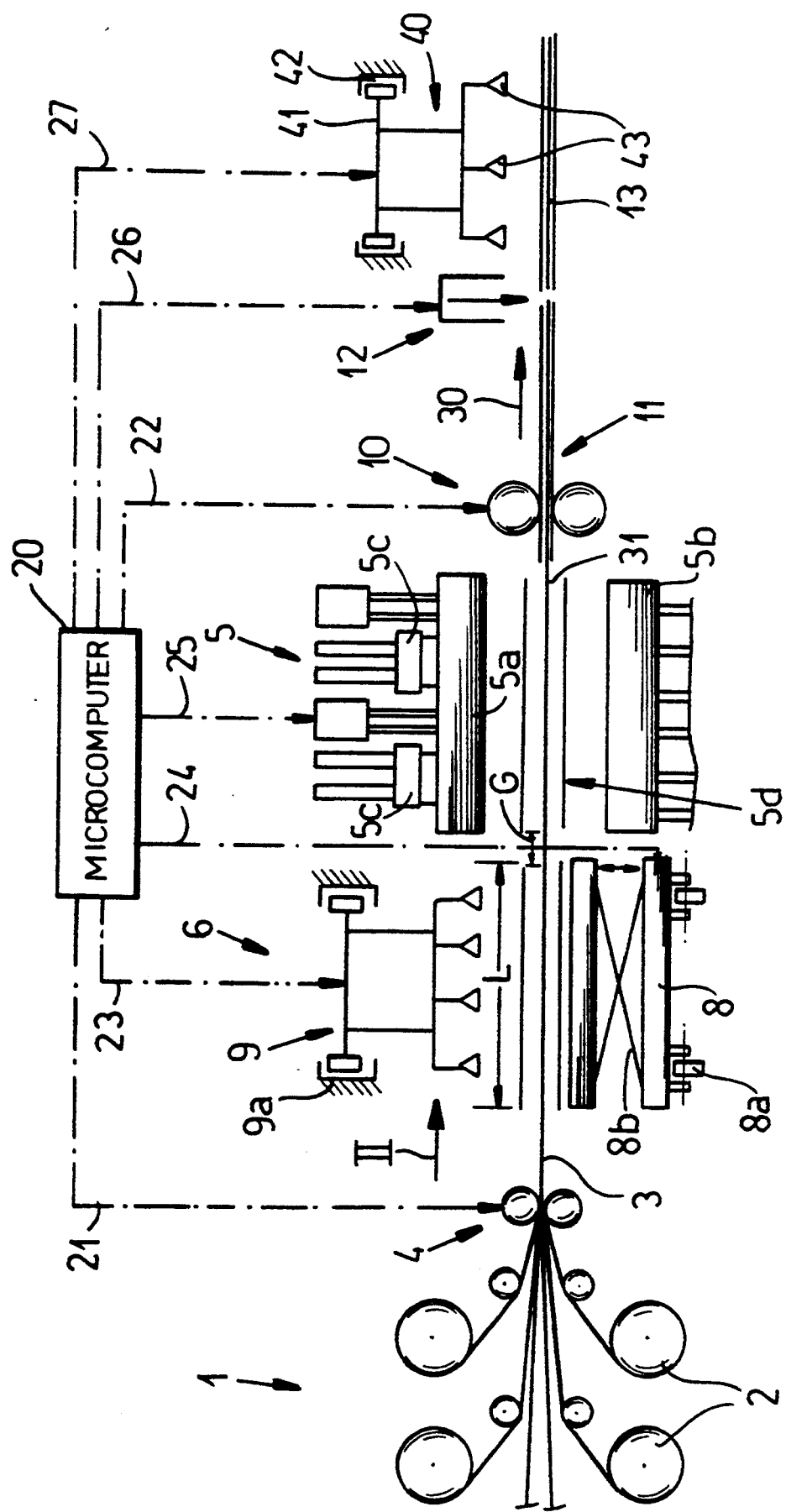
FIG. 1 is a side-elevational view in highly diagrammatic form of an apparatus for producing decor laminate board according to the invention.

The apparatus shown in the drawing can produce decor laminate boards with a core layer and at least one decor layer using heat and pressure to form the laminate.

The apparatus commercials a supply station 1 for supplying the core paper webs from a plurality of coils or rolls 2 of these webs. The core paper webs 3 drawn from the respective coils are stacked to form a core as they pass through a common clamping roll unit 4 which advances the core web 3 in the feed direction represented by the arrow 30 (FIG. 1) while applying a drag to the core so that it is prevented from sagging to any significant extent.

At the other end of the tensioned stretch 31 is a pair of rollers 10 through the nip of which the band is advanced in a stepwise or intermittent manner while maintaining the tension on this band.

Spaced from the pair of rollers 4 and upstream of the rollers 10 is a single-level platen press 5, the platens of which can be seen at $5a$ and $5b$ in FIG. 1 and which are heated.

Hydraulic units $5c$ serve to apply pressure to a stack or packet $5d$ positioned within the press.

Between the clamping roll unit 4 and the single level platen press 5, a foil delivery station 6 is provided at which decor foils of plastic or metal as represented at 7 can be applied to the upper surface and/or the underside of the core 3.

Figure 2:
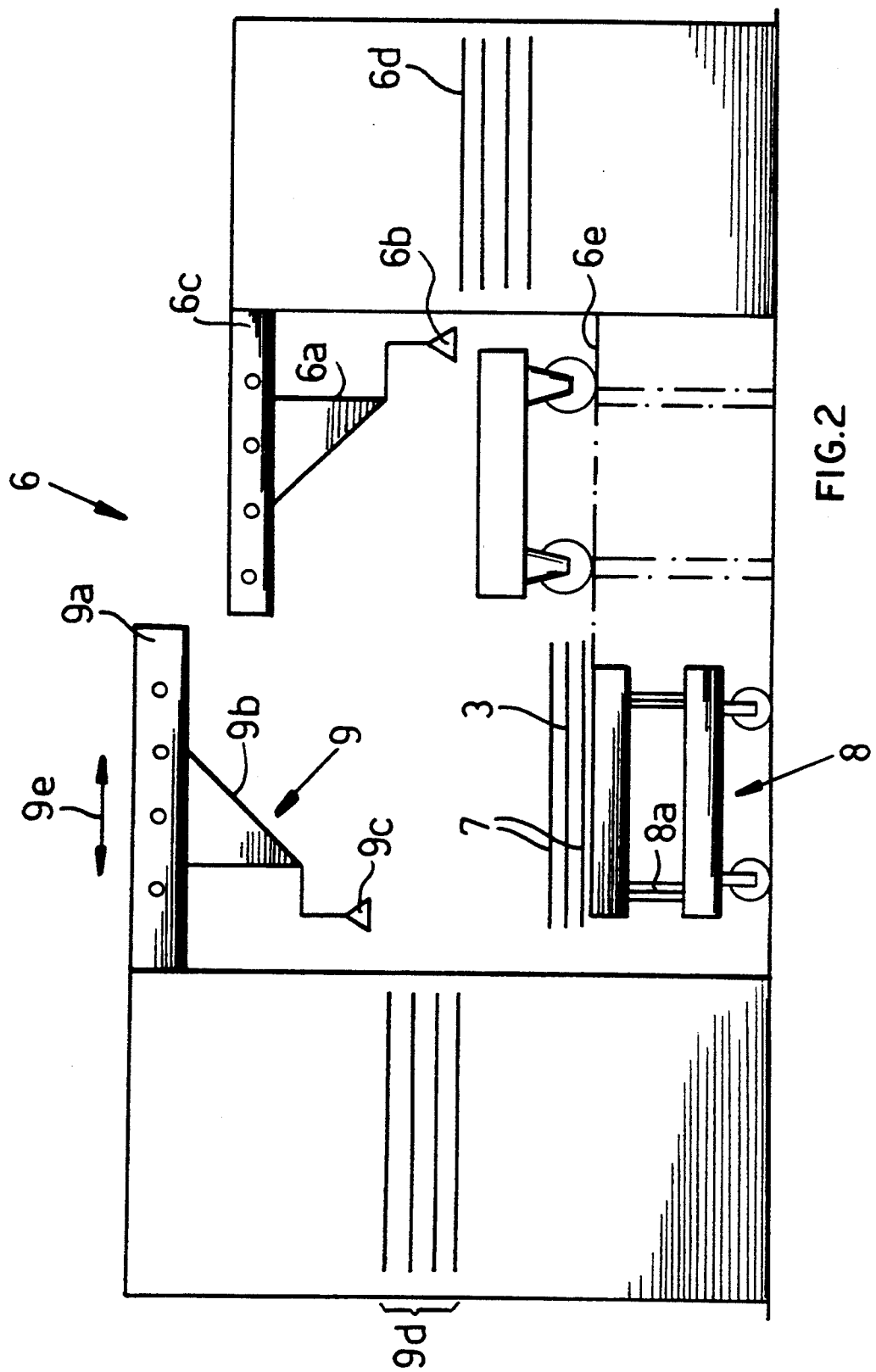
FIG. 2 is a diagrammatic view in the direction of arrow II of FIG. 1.

For this purpose, a vertically shiftable stage or platform 8 and a foil delivery unit 9 are provided below and above the core 3, respectively, these units being described in greater detail in connection with FIG. 2 and being shiftable, as is apparent from the guides $9a$ and the rollers $8a$ of the suction unit 9 and the stage 8, in a direction perpendicular to the plane of the paper in FIG. 1, i.e. horizontally and transverse to the feed direction 30.

The foil 7 can be given an electrostatic charge so that it will adhere without additional adhesive means to the upper or lower surfaces of the core 3 and thereby form the press packet $5d$. The increment of displacement of the band 31 and the press packet $5d$ is equal to the length L of the foil segments 7 plus a gap G between successive packets.

Downstream of the clamping rolls 10, at which the decor laminate boards 11 are integral with the band 31, a trimming and separating unit 12 is provided for separating boards 13 from the band 31. The trimmer and cutter 12 can be a saw blade displaceable perpendicular to the plane of the paper in FIG. 1 across the width of the band 31. The boards 13 can be then transported away by a delivery unit 40. The unit 40 may include a carriage 41 displaceable in guides 42 perpendicular to the plane of the paper in FIG. 1 and formed with suction heads 43 which can engage the upper surface of the board 13 and can stack the finished boards as may be desired.

To coordinate the operation of the apparatus, I can provide a microcomputer 20 which can generate the various movements with the proper timing. For example, the microcomputer 20 can control via lines 21 and 22 the roller units 4 and 10, respectively, to advance the band 31 in increments L+G while maintaining the tension, preventing sag previously described and can maintain intervals between the advance of the band 31 sufficient to allow cycling of the press 5 as controlled by the line 25 and application of the foil 7 as represented by the control lines 23 and 24, as well as severing of the finished board via line 26 and the transport of the finished board as controlled by line 27.

As will be apparent from FIG. 1, the stage 8 can be charged by a suction carriage 6a having suction heads 6b and movable in guides 6c transversely to the feed direction 30 with the lower foil from a magazine or supply 6d in which foil segments are stacked after having been cut from a continuous foil supply such as a roll of the foil.

The platform 6e may be raised to lift the stage 8 into position to receive a foil from the supply 6d during advance of the band 31 and, once the foil is applied to the stage 8, the platform 6e can be lowered and the stage 8 shifted to the left (FIG. 2) to a location below the core 3. During the next standstill of the core 3, the platform 8 can be raised by a linkage 8a (FIGS. 1 and 2) to lift the lower foil 7 against the underside of the core 3 while the suction carriage 9b displaceable in the guides 9a has its suction heads 9c withdraw a foil from the supply 9d and deposit it on the core 3 by movement in the horizontal direction of arrow 9e which is transverse to the direction 30.

In operation, therefore, the kraft paper webs forming the core 3 are drawn as endless strips from the coils 2 in the cadence of operation of the single-stage platen press 5 and the decor foils 7 are applied to the core 3 by carrying them transversely onto the core. The resulting press stack 5d is shifted with the band 31 into the open press and the press is closed to hot-press the stack and form the board. The kraft paper webs 3 thus function as a conveyor band for charging and discharging the press.

After the pressed boards, interconnected via the band 31 and the continuous core, is advanced out of the press, the individual boards 13 are separated from the band. The tension applied to the stretch 31 should be sufficient so that there is practically no sag. For these purpose, the rollers 4 can maintain a suitable drag when rollers 10 are driven and both pairs of rollers continuously clampingly engage the band 31.

I claim:

1. An apparatus for making laminate board, the apparatus comprising:

supply means including a plurality of rolls for feeding respective core-forming flexible webs in a feed direction along a transport path;

an upstream set of rollers at a first stacking location downstream of said supply means for stacking the webs to form a core having upper and lower surfaces and for pinching said core;

a downstream set of rollers pinching the core downstream of a pressing location, which is located downstream of the first stacking location, for maintaining a tension along a path over which the core extends continuously from the first stacking location through the pressing location, the tension being sufficient to prevent substantial sag of the core along the path;

control means connected to the sets of rollers for intermittently advancing the core in the feed direction along the path in steps having a length equal to a length of laminate boards to be fabricated while maintaining the tension;

means at a second stacking location between the upstream set of rollers and the pressing location for applying to at least one of the upper and lower surfaces of the core a decor cover foil of plastic or metal having substantially said length of said laminate boards to be fabricated by shifting the cover foil onto the core transversely to the feed direction during an interval between advances of the core to form a press stack from the cover foil and the core, said means for applying a cover foil including:
a platform disposed below said core,
means for depositing a cover foil on said platform from a supply of cover foils, and
means for shifting said platform beneath said core and raising said platform toward said core;

a single-level platen press at said pressing location for receiving the press stack and hot pressing the press stack to produce a laminate board from each of the press stacks between advances of the core; and means downstream of the pressing station for cutting the laminate board from the core.

* * * * *